(12) United States Patent
Martini et al.

(10) Patent No.: US 11,289,619 B2
(45) Date of Patent: Mar. 29, 2022

(54) AUTOMATICALLY LIMITING POWER CONSUMPTION BY DEVICES USING INFRARED OR RADIO COMMUNICATIONS

(71) Applicant: Dell Products L.P., Round Rock, TX (US)

(72) Inventors: Gian Martini, Porto Alegre (BR); Mauricio Martins da Costa, Porto Alegre (BR)

(73) Assignee: Dell Products L.P., Round Rock, TX (US)

( * ) Notice: Subject to any disclaimer, the term of this patent is extended or adjusted under 35 U.S.C. 154(b) by 265 days.

(21) Appl. No.: 16/671,729

(22) Filed: Nov. 1, 2019

(65) Prior Publication Data

US 2021/0135037 A1 May 6, 2021

(51) Int. Cl.
*H01L 29/66* (2006.01)
*H05B 47/19* (2020.01)
(Continued)

(52) U.S. Cl.
CPC ........ *H01L 31/1116* (2013.01); *G06F 1/3206* (2013.01); *H01L 29/41775* (2013.01);
(Continued)

(58) Field of Classification Search
CPC . H04W 4/80; H04W 4/04; H04B 3/54; G09G 3/006; H04N 1/00896; H04N 1/00835; H05B 33/0845
See application file for complete search history.

(56) References Cited

U.S. PATENT DOCUMENTS 4,163,123 A 7/1979 Brodsky et al.
4,920,570 A 4/1990 West et al.
(Continued)

FOREIGN PATENT DOCUMENTS

CA 2240840 C 9/2001
CH 600727 A5 6/1978
(Continued)

*Primary Examiner* — Iqbal Zaidi
(74) *Attorney, Agent, or Firm* — Ryan, Mason & Lewis, LLP

(57) ABSTRACT

Methods, apparatus, and processor-readable storage media for automatically limiting power consumption by devices using infrared or radio communications are provided herein. An example computer-implemented method includes detecting, via at least one photodiode of an emitting sensor, one or more signals output by a user device within a predetermined proximity; automatically transitioning, via utilizing at least one transistor connected to the photodiode, and in response to detecting the one or more signals, the emitting sensor from a first power-consumption state to a second power-consumption state; transmitting one or more signals in response to transitioning from the first power-consumption state to the second power-consumption state; and subsequent to transmitting, automatically transitioning, via utilizing the at least one transistor, the emitting sensor from the second power-consumption state to the first power-consumption state after a predetermined amount of time has elapsed during which no signals were detected.

20 Claims, 10 Drawing Sheets

(51) Int. Cl.
*H04W 52/02* (2009.01)
*G06F 1/3206* (2019.01)
*H01L 31/111* (2006.01)
*H01L 29/745* (2006.01)
*H01L 29/417* (2006.01)

(52) U.S. Cl.
CPC ...... *H01L 29/66378* (2013.01); *H01L 29/745* (2013.01); *H04W 52/0254* (2013.01); *H05B 47/19* (2020.01)

(56) References Cited

U.S. PATENT DOCUMENTS

| | | |
|---|---|---|
| 5,152,003 A | 9/1992 | Poch |
| 5,506,911 A | 4/1996 | Neuman et al. |
| 5,808,551 A | 9/1998 | Yarnall, Jr. et al. |
| 5,850,610 A | 12/1998 | Testani et al. |
| 5,883,927 A | 3/1999 | Madsen et al. |
| 6,847,725 B1 | 1/2005 | Neuman et al. |
| 7,095,981 B1 | 8/2006 | Varoba et al. |
| 7,639,951 B2 | 12/2009 | Hirayama |
| 9,936,442 B1 | 4/2018 | Noonan et al. |
| 2001/0055399 A1 | 12/2001 | Ullrich |
| 2009/0258599 A1 | 10/2009 | Basine |
| 2014/0004548 A1 | 1/2014 | Gordon |
| 2014/0184384 A1 | 4/2014 | Zhu et al. |
| 2016/0189514 A1 | 6/2016 | Todasco et al. |
| 2017/0038787 A1 | 2/2017 | Baker et al. |
| 2017/0048678 A1 | 2/2017 | Hong et al. |
| 2017/0178483 A1 | 6/2017 | Shapiro et al. |
| 2017/0257506 A1* | 9/2017 | Sato .................. H04N 1/00742 |
| 2018/0285544 A1* | 10/2018 | Chang ................ G06K 9/00892 |
| 2020/0068351 A1 | 2/2020 | Galvez et al. |
| 2021/0082352 A1* | 3/2021 | Lee ......................... G01K 7/01 |

FOREIGN PATENT DOCUMENTS

| | | |
|---|---|---|
| CN | 1108728 C | 8/1998 |
| EP | 0517323 A2 | 12/1992 |
| EP | 0803170 B1 | 3/2006 |
| EP | 3319338 A1 | 5/2018 |
| FR | 2786300 A1 | 5/2000 |
| GB | 2369743 A | 6/2002 |
| JP | 5015423 B2 | 4/2005 |
| WO | 1994011967 A1 | 5/1994 |
| WO | 2002017130 A2 | 2/2002 |
| WO | 2002065670 A1 | 8/2002 |

* cited by examiner

US 11,289,619 B2

1

AUTOMATICALLY LIMITING POWER CONSUMPTION BY DEVICES USING INFRARED OR RADIO COMMUNICATIONS

FIELD

The field relates generally to information processing systems, and more particularly to techniques for managing power consumption in such systems.

BACKGROUND

Many devices, including televisions, sound systems, garage doors, air conditioners, etc., rely on remote controllers. Such devices commonly maintain a significant portion of their power supply units activated to receive commands from remote controllers or other similar devices. This standby power used to keep such devices and/or subsystems thereof online often results in non-trivial power losses and added strain on device components that impacts the overall device power consumption and lifespan.

SUMMARY

Illustrative embodiments of the disclosure provide techniques for automatically limiting power consumption by devices using infrared or radio communications. An exemplary computer-implemented method includes detecting, via at least one photodiode of an emitting sensor, one or more signals output by a user device within a predetermined proximity, and automatically transitioning, via utilizing at least one transistor connected to the at least one photodiode, and in response to detecting the one or more signals, the emitting sensor from a first power-consumption state to a second power-consumption state, wherein the first power-consumption state represents less power consumption than does the second power-consumption state. Such a method also includes transmitting one or more signals in response to transitioning the emitting sensor from the first power-consumption state to the second power-consumption state. Further, such a method includes, subsequent to transmitting the one or more signals, automatically transitioning, via utilizing the at least one transistor, the emitting sensor from the second power-consumption state to the first power-consumption state after a predetermined amount of time has elapsed during which no signals were detected via the at least one photodiode.

Illustrative embodiments can provide significant advantages relative to conventional device power management techniques. For example, challenges associated with decreased device lifespans are overcome in one or more embodiments through automated transitioning of devices, via one or more transistor arrangements, into and out of deep-sleep states.

These and other illustrative embodiments described herein include, without limitation, methods, apparatus, systems, and computer program products comprising processor-readable storage media.

2

Figure 3:
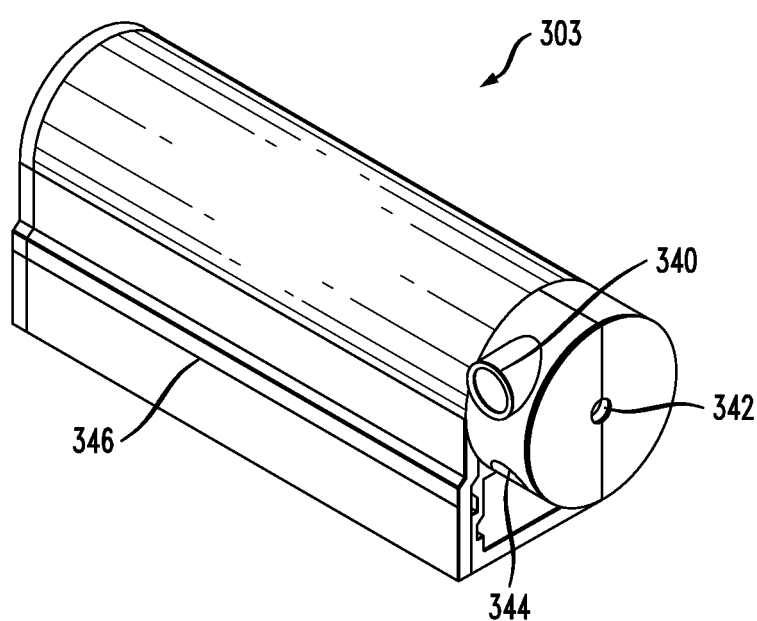

FIG. 3 shows an example emitting sensor utilized in one or more embodiments.

Figure 4:
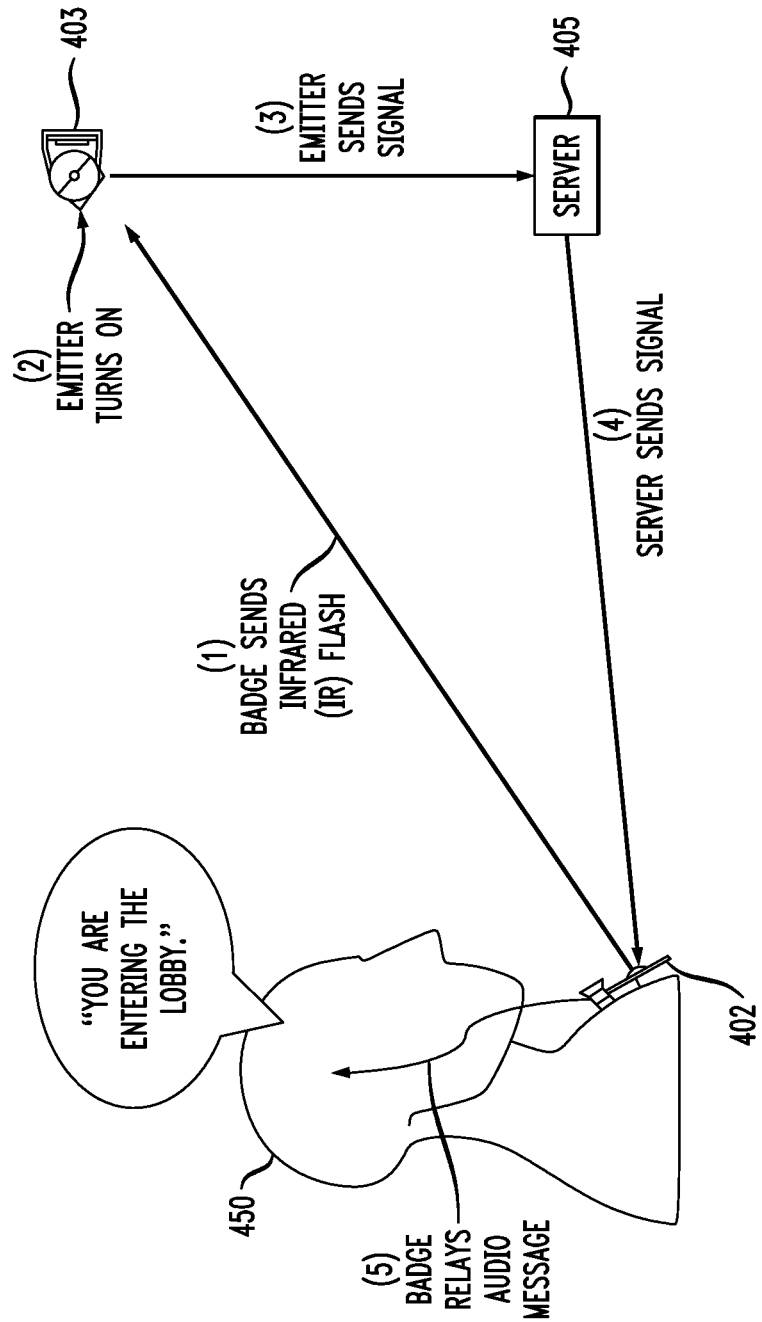

FIG. 4 shows an example interaction between an emitting sensor, a server, and a user identification device in an illustrative embodiment.

Figure 5:
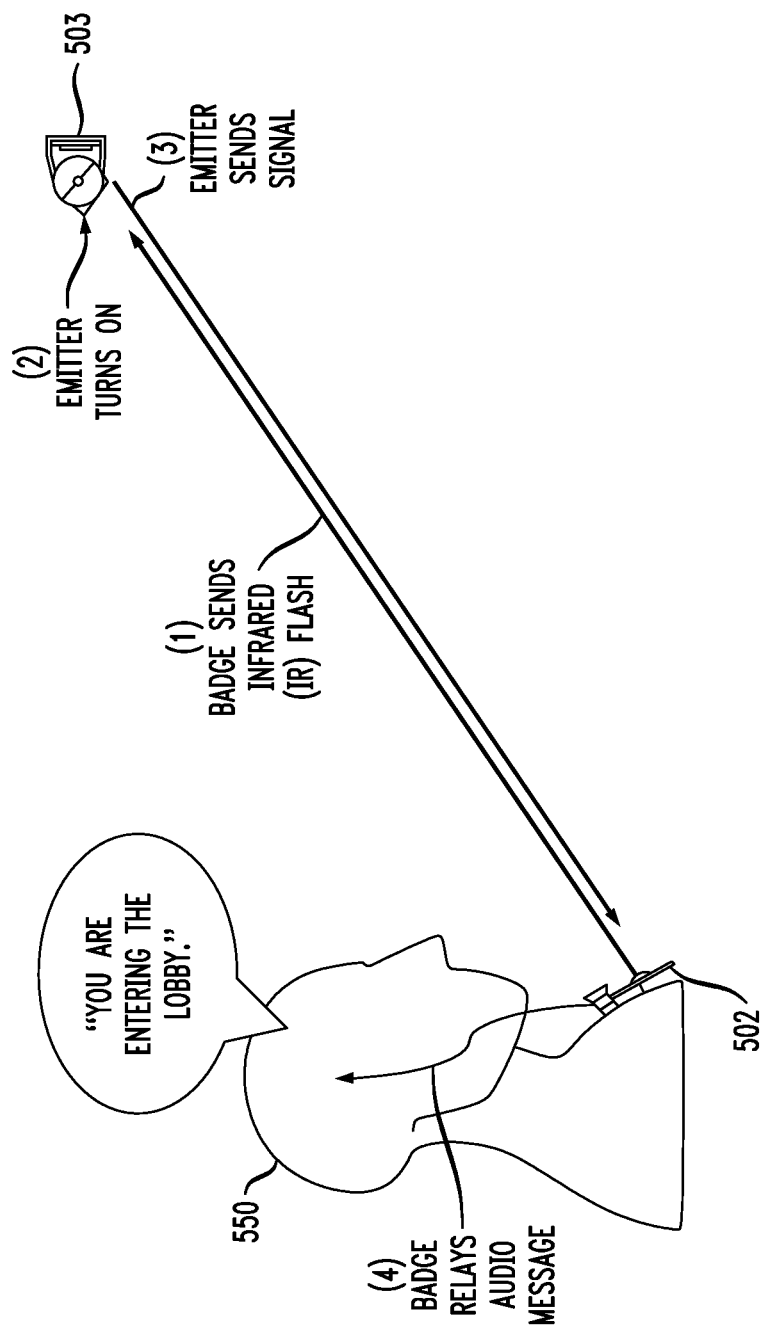

FIG. 5 shows an example interaction between an emitting sensor and a user identification device in an illustrative embodiment.

Figure 6:
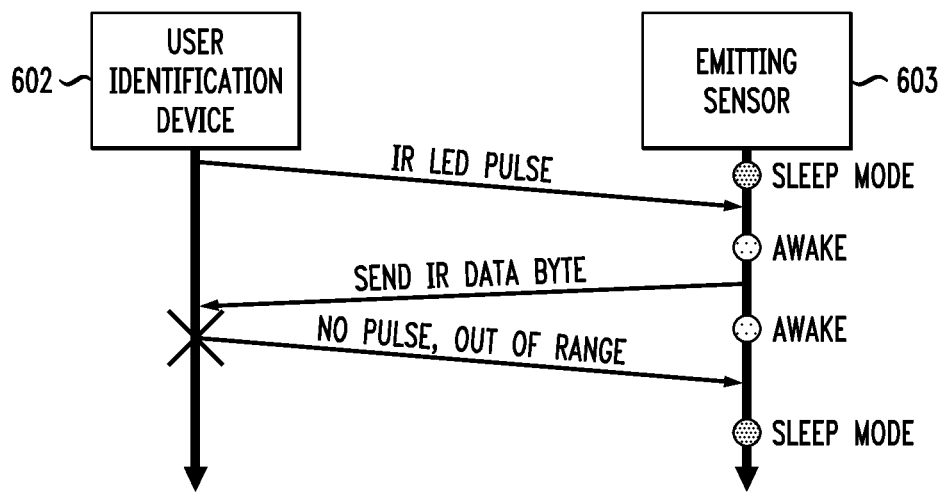

FIG. 6 shows message exchanges and related sleep state transitions in emitting sensors in an illustrative embodiment.

Figure 7:
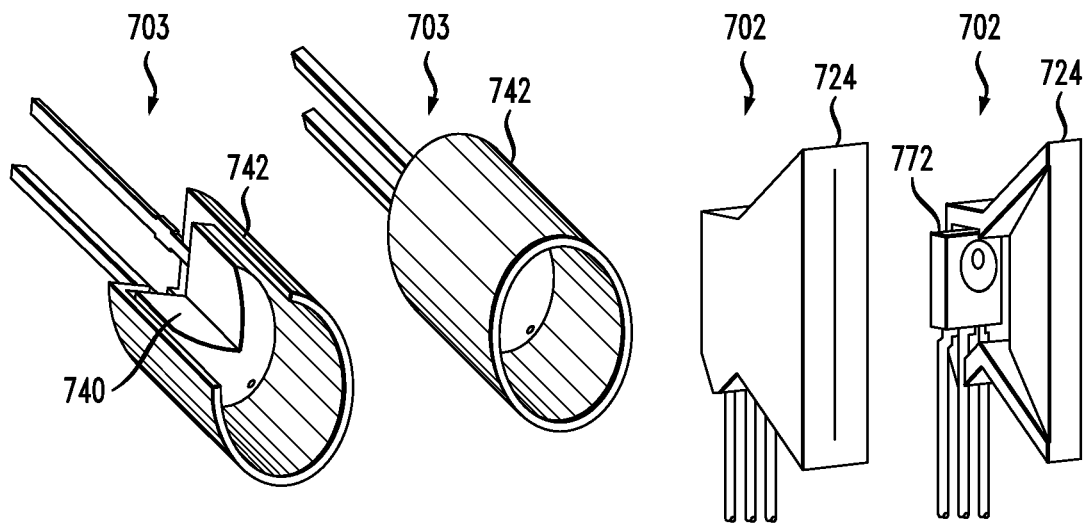

FIG. 7 shows an emitting sensor occluder and a user identification device dark chamber in an illustrative embodiment.

Figure 8:
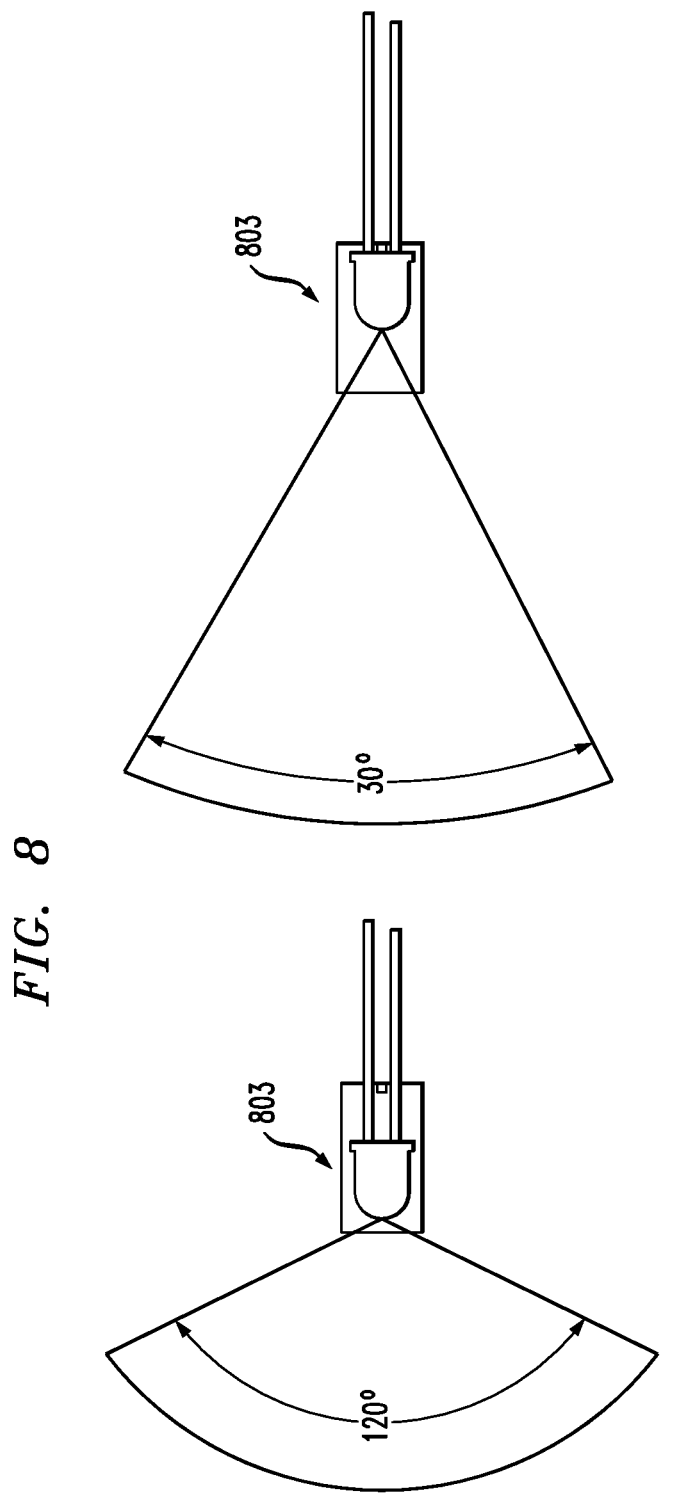

FIG. 8 shows an occluder as a focusing mechanism in an illustrative embodiment.

Figure 9:
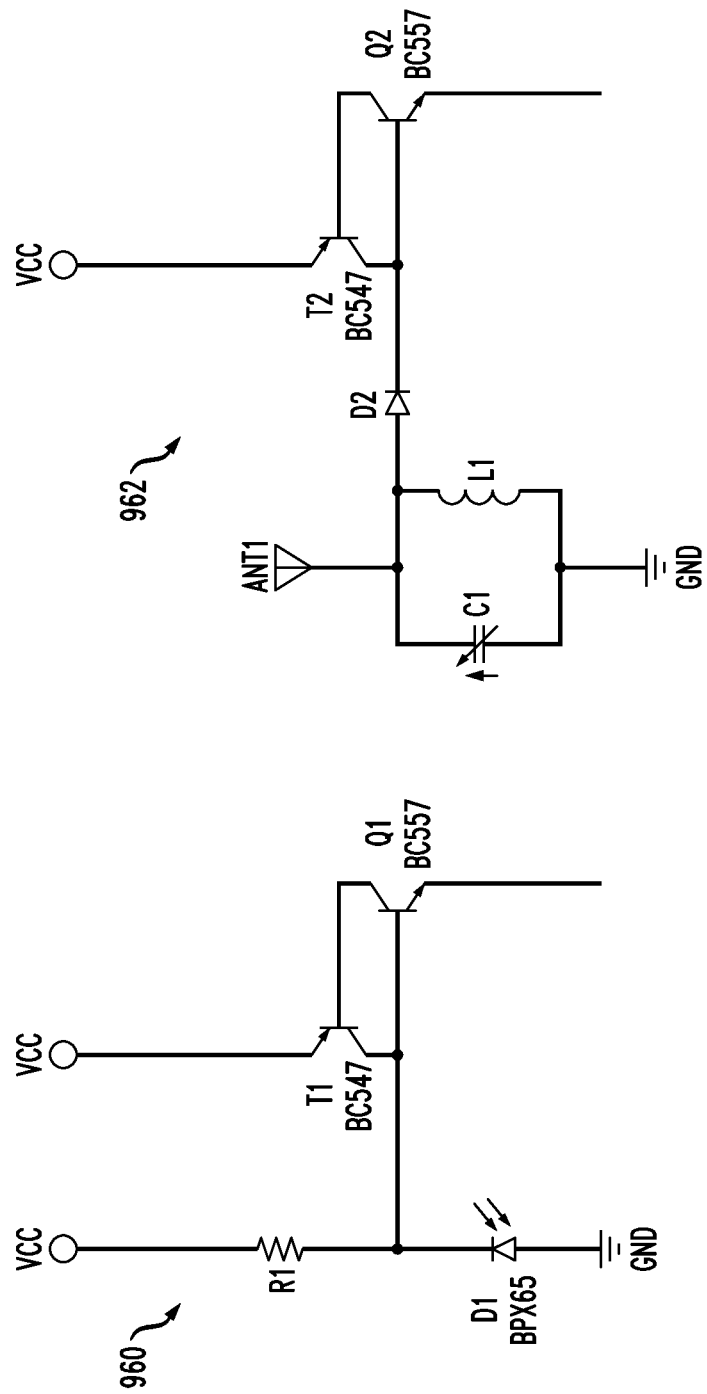

FIG. 9 shows an infrared switch and a radio switch in an illustrative embodiment.

Figure 10:
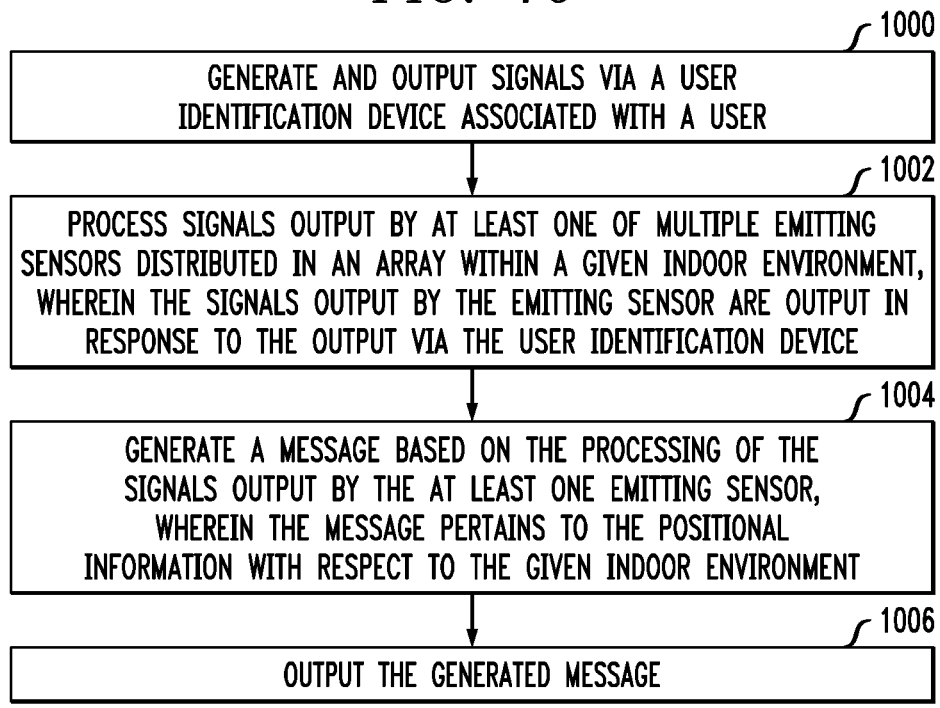

FIG. 10 is a flow diagram of a process for providing positional information via use of distributed sensor arrays in an illustrative embodiment.

Figure 11:
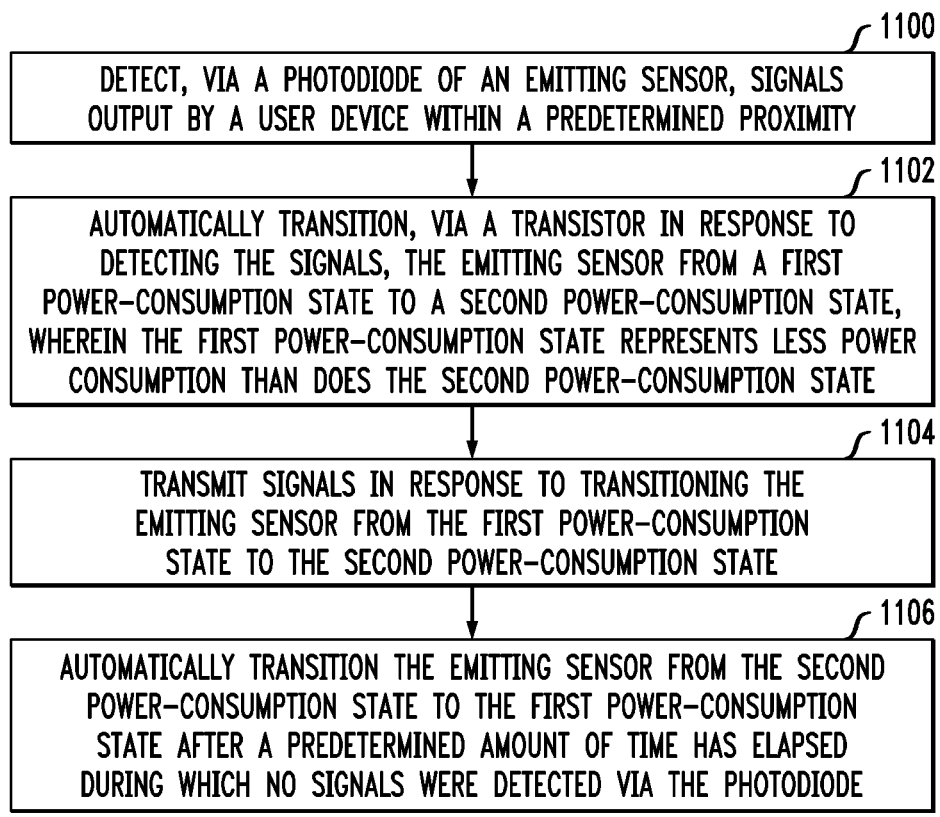

FIG. 11 is a flow diagram of a process for automatically and efficiently limiting power consumption by emitting sensors in an illustrative embodiment.

Figure 12:
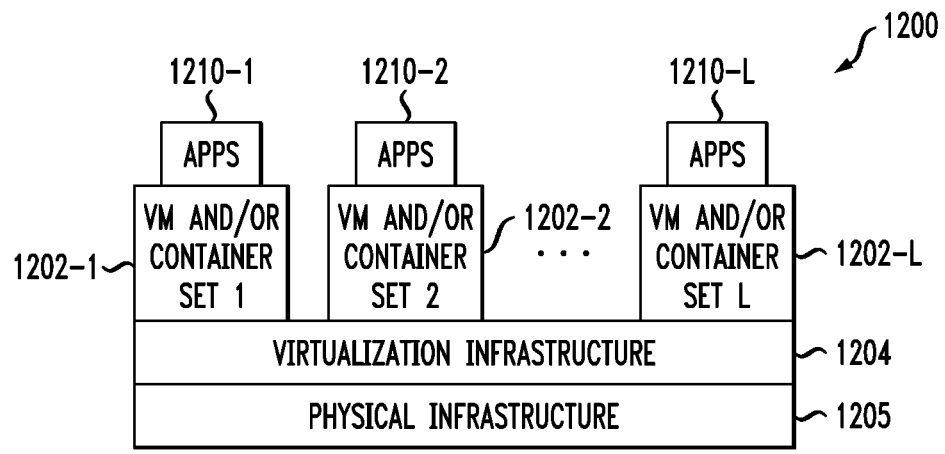
Figure 13:
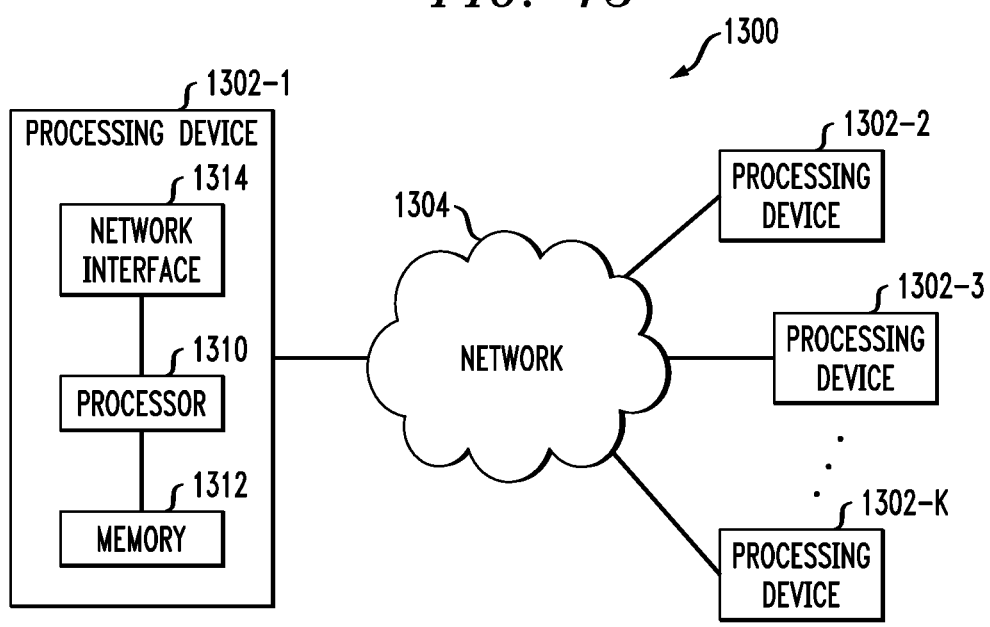

FIGS. 12 and 13 show examples of processing platforms that may be utilized to implement at least a portion of an information processing system in illustrative embodiments.

DETAILED DESCRIPTION

Illustrative embodiments will be described herein with reference to exemplary information processing system and associated computers, servers, and/or other types of processing devices. It is to be appreciated, however, that the invention is not restricted to use with the particular illustrative information processing system and device configurations shown. Accordingly, the term "information processing system" as used herein is intended to be broadly construed, so as to encompass, for example, any system comprising multiple processing devices that are networked and/or implemented within a given environment.

Figure 1:
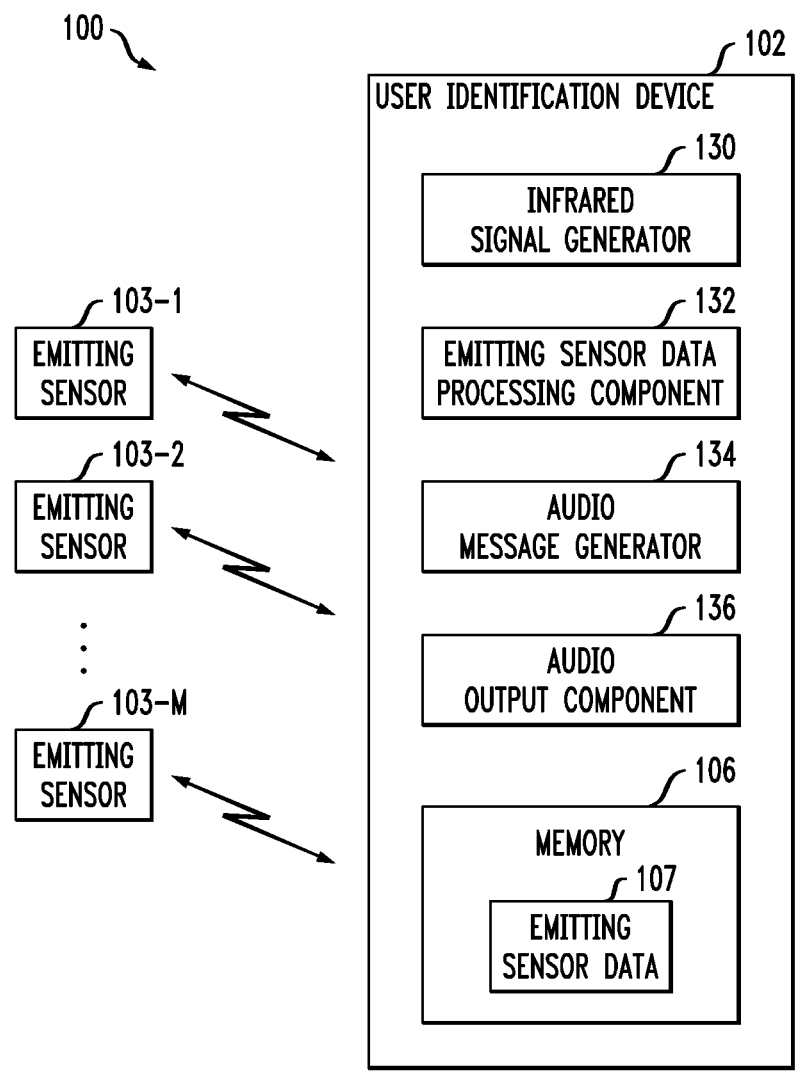
FIG. 1 shows an information processing system configured for providing positional information via use of distributed sensor arrays in an illustrative embodiment.

FIG. 1 shows an information processing system 100 configured in accordance with an illustrative embodiment. FIG. 1 presents merely an example embodiment incorporating techniques and hardware componentry for automatically limiting power consumption by devices using infrared or radio communications, as further detailed herein. Accordingly, the information processing system 100 comprises a plurality of emitting sensors 103-1, 103-2, . . . 103-M, collectively referred to herein as emitting sensors 103. In one or more embodiments, the emitting sensors 103 can be coupled to a network, which can include a sub-network or other related portion of the information processing system 100. Also positioned within such an information processing system 100 is (at least one) user identification device 102.

The user identification device 102 may comprise, for example, a badge (as further detailed herein), as well as a user device such as a mobile telephone, tablet computer, or other type of computing device. Such devices are examples of what are more generally referred to herein as "processing devices."

The user identification device 102 in some embodiments comprises a processing device associated with a group of users, particular company, organization or other enterprise. In addition, at least portions of the information processing system 100 may also be referred to herein as collectively comprising an "enterprise network." Numerous other operating scenarios involving a wide variety of different types and arrangements of processing devices and networks are possible, as will be appreciated by those skilled in the art. For example, one or more embodiments involving emitting sensors 103 and user identification device 102 do not include the use of a network. In such an embodiment, the emitting sensors 103 and user identification device 102 communicate with each other via the wireless transfer of signals and/or messages when within a given proximity.

Also, it is to be appreciated that the term "user" in this context and elsewhere herein is intended to be broadly construed so as to encompass, for example, human, hardware, software or firmware entities, as well as various combinations of such entities.

The network noted above and further described herein in connection with one or more embodiments can comprise a portion of a global computer network such as the Internet, although other types of networks can be part of the information processing system 100, including a wide area network (WAN), a local area network (LAN), a satellite network, a telephone or cable network, a cellular network, a wireless network such as a Wi-Fi or WiMAX network, or various portions or combinations of these and other types of networks. The information processing system 100 in some embodiments therefore comprises combinations of multiple different types of networks, each comprising processing devices configured to communicate using internet protocol (IP) or other related communication protocols.

Additionally, user identification device 102 includes an associated memory 106 configured to maintain data 107 pertaining to one or more emitting sensors.

Also associated with user identification device 102 can be one or more input-output devices, which illustratively comprise keyboards, displays or other types of input-output devices in any combination. Such input-output devices can be used, for example, to support one or more user interfaces to user identification device 102, as well as to support communication between user identification device 102 and other related systems and devices not explicitly shown.

The user identification device 102 in the FIG. 1 embodiment is assumed to be implemented using at least one processing device. Each such processing device generally comprises at least one processor and an associated memory (such as memory 106), and implements one or more functional modules for controlling certain features of the user identification device 102. By way of example, user identification device 102 can comprise a processor coupled to a memory and a network interface.

The processor illustratively comprises a microprocessor, a microcontroller, an application-specific integrated circuit (ASIC), a field-programmable gate array (FPGA) or other type of processing circuitry, as well as portions or combinations of such circuitry elements.

The memory (106) illustratively comprises random access memory (RAM), read-only memory (ROM) or other types of memory, in any combination. The memory and other memories disclosed herein may be viewed as examples of what are more generally referred to as "processor-readable storage media" storing executable computer program code or other types of software programs.

One or more embodiments include articles of manufacture, such as computer-readable storage media. Examples of an article of manufacture include, without limitation, a storage device such as a storage disk, a storage array or an integrated circuit containing memory, as well as a wide variety of other types of computer program products. The term "article of manufacture" as used herein should be understood to exclude transitory, propagating signals.

The network interface allows the user identification device 102 to communicate over a network with the emitting sensors 103, and illustratively comprises one or more conventional transceivers.

The user identification device 102 further comprises an infrared signal generator 130, an emitting sensor data processing component 132, an audio message generator 134, and an audio output component 136.

It is to be appreciated that this particular arrangement of elements 130, 132, 134 and 136 illustrated in the user identification device 102 of the FIG. 1 embodiment is presented by way of example only, and alternative arrangements can be used in other embodiments. For example, the functionality associated with elements 130, 132, 134 and 136 in other embodiments can be combined into a single module, or separated across a larger number of modules. As another example, multiple distinct processors can be used to implement different ones of elements 130, 132, 134 and 136 or portions thereof.

At least portions of the elements 130, 132, 134 and 136 may be implemented at least in part in the form of software that is stored in memory and executed by a processor.

It is to be understood that the particular set of elements shown in FIG. 1 involving user identification devices 102 and emitting sensors 103 of information processing system 100 is presented by way of illustrative example only, and in other embodiments additional or alternative elements may be used. Thus, another embodiment includes additional or alternative systems, devices and other network entities, as well as different arrangements of modules and other components.

An exemplary process utilizing user identification devices 102 and emitting sensors 103 in information processing system 100 will be described in more detail with reference to the flow diagrams of FIG. 10 and FIG. 11.

Accordingly, at least one embodiment includes implementing an assistive guiding system (for example, for use by the vision impaired) that includes one or more wearable directional infrared user identification devices and/or transducers, and a set of fixed battery-powered directional infrared signal emitting sensors. In such an embodiment, the wearable device plays guiding audio messages based on which emitting sensor's signal is being detected. Additionally, such an embodiment includes taking advantage of the light properties of infrared signals by shaping it via one or more occluders and reflectors to create well-defined volumes of space. The wearable device, in turn, detects such volumes and provides the user with information about its location and facing direction. Accordingly, one or more embodiments include enabling the implementation of complex wireless sensor networks utilizing strategic placing and shaping of multiple light volume emitting sensors. Additionally, in such an embodiment, the issue of maintaining a large number of battery-powered sensors is resolved via an efficient battery-saving mechanism further described herein.

Infrared (IR) is invisible, harmless to humans and can relay information wirelessly and directionally. Infrared signals are made from light at an invisible corner of the spectrum, meaning that such signals can be focused, collimated, occluded, diffused and/or reflected, allowing for a wide range of options when the necessity of high space granularity is needed. Accordingly, at least one embodiment includes utilizing an 8-bit signal over a 38 kHz carrier wave.

By reducing the complexity of the signal and moving the messages to wearable hardware, low-complexity signal emitting sensors can be utilized, which reduces both cost and power consumption for the system (potentially allowing the implementation of a larger network of emitting sensors to be placed with a given indoor environment). Additionally, one or more embodiments include facilitating multiple types of interaction via a wearable hardware and a set of emitting sensors, such as, for example, multi-language interactions and notifications.

Figure 2:
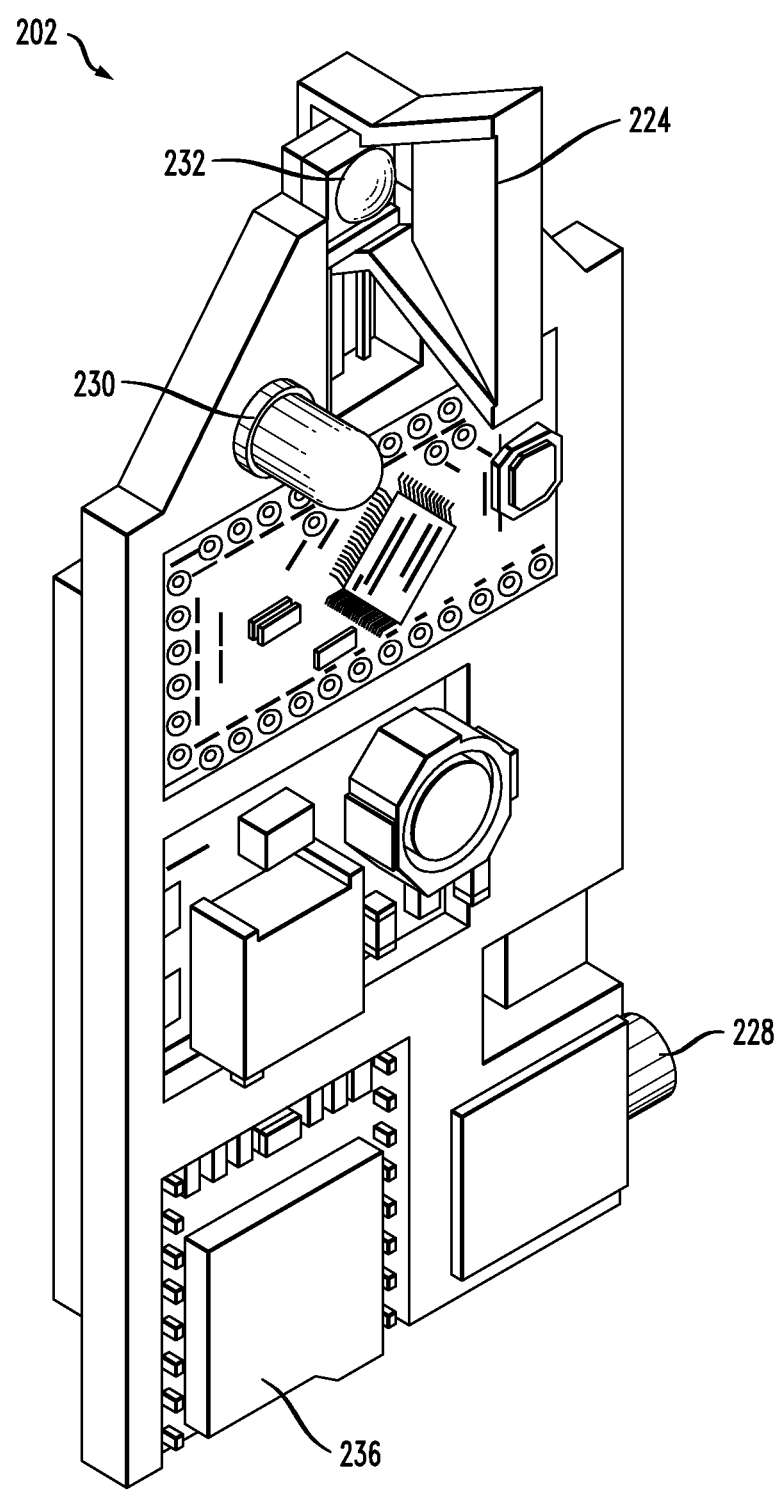
FIG. 2 shows an example user identification device utilized in one or more embodiments.

FIG. 2 shows an example user identification device utilized in one or more embodiments. By way of illustration, FIG. 2 depicts user identification device 202 (also referred to herein as a wearable badge), which includes a dark chamber 224, a headphone (e.g., P2) jack 228, an IR flash light-emitting diode (LED) 230, an IR receiver module 232, and an audio (e.g., MP3) player module 236.

FIG. 3 shows an example emitting sensor utilized in one or more embodiments. By way of illustration, FIG. 3 depicts an emitting sensor 303, which includes an emitter photodiode 340, a moving head 342, a receiver photodiode 344, and a circuit and battery case 346.

The levels of performance required by the key power-consuming components of the emitting sensor, namely, an IR emitting LED and a microcontroller unit, are facilitated by the fact that the sensors are turned off when not being used. Accordingly, one or more embodiments include maintaining emitting sensor devices on a virtually powerless mode waiting for a passing wearable device to transmit an activating signal (also referred to herein as a "wake-up" signal). In such an embodiment, the emitting sensors only turn on when there's a user identification device facing the sensor and emitting a wake-up signal, a functionality achieved using a microcontroller's sleep mode. Such an embodiment enables emitting sensors to run on the order of a couple hundred microamperes/hour when no wearable user identification device is within an activation proximity to receive the emitting sensor's message.

Additionally, to achieve such long-lasting autonomy, at least one embodiment includes implementing and/or utilizing a bi-stable circuit comprising an amplified photodiode tied to a gate turn-off (GTO) thyristor made of at least one radio signal transistor. Such a thyristor includes an ability to switch high direct current (DC) currents while also including bi-stable circuits. Once triggered by a signal in its base, the emitting sensor will keep conducting until another signal shuts the sensor off. As noted, such an embodiment includes implementing low power transistors arranged as a thyristor, and also implementing a photodiode to create the above-detailed trigger signal when illuminated and/or activated by an infrared source (for example, from a wearable device).

While a microcontroller in sleep mode commonly uses dozens of microamperes to maintain low-level functions to detect a wake-up signal, the proposed device in accordance with one or more embodiments consumes a few dozen nanoamperes when in non-conducting mode, effectively mimicking the sleep system of a microcontroller but at orders of magnitude less power consumption. When not transmitting, such an emitting sensor device's consumption is on par with many alkaline and zinc-carbon batteries' self-discharging rates, which can translate into years of autonomy before expiration.

Given such a device's term of autonomy, at least one embodiment includes enabling the creation of complex and/or significant wireless sensor networks. By way merely of illustration, such devices can be used to mark doorways in a building for use by in connection with aiding the visually impaired, access control or statistics, etc. Additionally, as further detailed herein, such devices can be calibrated by focusing or widening the emitting sensor's beam, thereby changing how a message is detected.

FIG. 4 shows an example interaction between an emitting sensor, a server, and a user identification device in an illustrative embodiment. By way of illustration, FIG. 4 depicts user identification device (also referred to as a badge) 402 being worn by user 450. Also, FIG. 4 depicts emitting sensor (also referred to as an emitter) 403 and server 405. As additionally illustrated, the first step (1) includes the badge 402 outputting at least one infrared (IR) flash, and in the second step (2), the emitter 403 is activated and/or turned-on/woken-up (in response to sensing the badge's IR flash). The third step (3) includes the emitter 403 sending a signal to the server 405, and the fourth step (4) includes the server 405 (in response to receiving the emitter's signal) sending a signal to the badge 402. Additionally, in the fifth step (5), the badge 402 generating (in response to receiving the server's signal) and relaying an audio message (e.g., "You are entering the lobby.") to the user 450.

FIG. 5 shows an example interaction between an emitting sensor and a user identification device in an illustrative embodiment. By way of illustration, FIG. 5 depicts user identification device (badge) 502 being worn by user 550, as well as emitting sensor (also referred to as an emitter) 503. As additionally illustrated, the first step (1) includes the badge 502 outputting at least one IR flash, and in the second step (2), the emitter 503 is activated and/or turned-on/woken-up (in response to sensing the badge's IR flash). The third step (3) includes the emitter 503 sending a signal to the badge 502, and the fourth step (4) includes the badge 502 generating (in response to receiving the emitter's signal) and relaying an audio message (e.g., "You are entering the lobby.") to the user 550.

At least one embodiment includes achieving directional detection scheme by shaping the IR emitting sensors signal into volume cones using tubes to reduce or increase the size of the beam. In an example embodiment, the tubes take the form of hollow screws with the IR LED at a fixed distance inside of the tube in relation to the emitting sensor, and rotating the tubes left or right exposes or occludes the LED, creating a focusing effect.

Additionally, at least one embodiment includes incorporating a radio-communication (e.g., Wi-Fi) module to the wearable (badge) to detect the triggered emitting sensors in real-time. Such an embodiment enables establishing knowledge of the latest position and directional facing of an individual wearing the device (badge). The rate of updates, precision of position and direction at each moment can primarily depend on the number of emitting sensors placed within the given environment.

Additionally, in one or more embodiments, each emitting sensor relays its identifier (ID) as well as an additional value (for example, a 4-bit number) representing the level of remaining battery life of the emitting sensor. Also, using the above-mentioned wireless module, the relayed information provided by one or more emitting sensors can be centralized.

FIG. 6 shows message exchanges and related sleep state transitions in emitting sensors in an illustrative embodiment. By way of illustration, FIG. 6 depicts user identification device 602 and emitting sensor 603. Specifically, emitting sensor 603 is initially in sleep mode, and awakes from sleep mode in response to sensing an IR LED pulse output by the user identification device 602. Subsequently, the emitting sensor 603 outputs IR data bytes to the user identification device 602. Upon not receiving an IR LED pulse from the user identification device 602 within a predetermined time period, the emitting sensor 603 re-enters sleep mode.

To address battery life limitations of emitting sensors facing conventional approaches, one or more embodiments includes leveraging the sleep mechanism and/or functionality present in microcontrollers. Such an embodiment includes enabling devices (such as emitting sensors) to enter a deep-sleep state, wherein such a device consumes mere nanowatts of power. For example, an emitting sensor under this state and connected to a battery can be active and/or online for as long as several years. Additionally, in accordance with such an embodiment, the activating or waking of a given device is carried out only upon receiving and/or processing a signal from a wearable device (badge) within a predetermined proximity.

In at least one embodiment, a wake-up system is implemented without the use of a microcontroller. Rather, such an embodiment includes utilizing an analog circuit (for example, a thyristor and IR photodiode) to detect an analog pulse that in turns powers on the microcontroller of the device (e.g., emitting sensor). The microcontroller, in such an embodiment, generates and outputs messages that include a unique ID and battery level information, and turns itself off when a wake-up signal has not been detected within a predetermined time span.

Additionally, one or more embodiments includes the use of a wearable hardware device (such as a user identification device or badge) which contains a phototransistor and a high-power IR LED, as well as hardware emitting sensors which contain a transmitting LED and a receiving photodiode. In such an embodiment, the high-power LED in the wearable hardware device outputs flashes periodically (e.g., every few seconds), which are detected by photodiodes in nearby emitting sensors. Accordingly, the photodiode "wakes up" the microcontroller in such an emitting sensor, which in turn starts transmitting a directional signal. After a predetermined interval (e.g., a few seconds) the emitting sensor returns to a deep-sleep mode.

FIG. 6, by way of example, shows how messages are exchanged between a user identification device and an emitting sensor, and how the sleep state of the emitting sensor is activated and/or deactivated as a user with the wearable user identification device approaches and moves away from an emitting sensor. The wearable user identification device wakes up the emitting sensor from a sleep mode, the emitting sensor sends its messages to be decoded by the user identification device, and as the user identification device moves away from the emitting sensor, the pulse (output by the user identification device) is no longer detected by the emitting sensor, which then returns to sleep mode.

FIG. 7 shows an emitting sensor occluder and a user identification device dark chamber in an illustrative embodiment. By way of illustration, FIG. 7 depicts two views of an emitting sensor 703 and two views of a user identification device 702. The first view of the emitting sensor 703 shows an interior view of a tube (also referred to herein as an occluder) 742 surrounding a light source 740. The second view of the emitting sensor 703 shows a full exterior view of the occluder 742. Additionally, the first view of the user identification device 702 shows an exterior view of a receiver 724, and the second view of the user identification device 702 shows an interior view of the receiver 724 which includes a dark chamber 772.

Accordingly, one or more embodiments include reducing the intensity and the angle of spread of an emitted signal's light. Such an embodiment includes implementing a dark chamber in the user identification device and a tube around the light source of emitting sensor to achieve these goals.

FIG. 8 shows an occluder as a focusing mechanism in an illustrative embodiment. By way of illustration, FIG. 8 depicts effects of the light spread angle output by an emitting sensor 803 in connection with the positioning of an occluder. Accordingly, such an embodiment includes facilitating focusing of the emitting sensor signal via sliding the occluder tube relative to the LED, which causes the light spread angle to be proportional to the proximity of the emitting sensor LED to the edge of the tube. Additionally, in at least one embodiment, a trimpot may be tuned in the emitting sensors for lower intensity signals. Further, a dark chamber on the user identification device creates an angle of reception as well as reduces the received signal's intensity. The dark chamber can be created, for example, via a slit and/or a hole to improve the detection of signals directly above or below the wearer as well as within a detection range of approximately 30° horizontally and over 120° vertically.

FIG. 9 shows an infrared switch and a radio switch in an illustrative embodiment. By way of illustration, FIG. 9 depicts an infrared switch 960 and a radio switch 962 as embodied within an example emitting sensor in accordance with at least one embodiment. Such switches can be contained, for example, with a GTO thyristor which includes an ability to switch high DC currents while also including bi-stable circuits. As further detailed herein, once triggered by a received and/or sensed signal, the emitting sensor (via utilization of the GTO thyristor and at least one of the switches depicted in FIG. 9) will continue conducting until another signal shuts the sensor off that is, until power is cut from the thyristor's input). Additionally, by using, for example, high-gain transistors to construct a thyristor, such a trigger signal can be on the order of microwatts, thereby allowing the thyristor to be triggered, for example, by a tuned LC tank circuit for radio communications and/or a photodiode and resister voltage divider.

As such, at least one embodiment includes implementing a system composed of a pair of radio transistors in a thyristor arrangement. An example objective of switches 960 and 962 depicted in FIG. 9 include powering-on a device (such as an emitting sensor) when an analog signal is received (e.g., a radio signal in connection with switch 962 or an infrared signal in connection with switch 960), interpret the signal digitally via a micro-controller, and determine if the main power supply of the device should be turned on or if the device should continue in its standby mode. In one or more embodiments, the amount of power required to make such determinations is on the order of microwatts, and the time that the switch(es) remain(s) online has a trivial impact on the overall performance and power consumption of the device.

One or more embodiments can also include implementing logic to facilitate the power supply of such a device to turn on in order to charge the battery of the device if it is determined that the device has been in standby mode for more than a predetermined amount of time. Such a self-charge mechanism can include, for example, at least one additional transistor and a 3.1 volt Zener diode.

FIG. 10 is a flow diagram of a process for providing positional information via use of distributed infrared sensor arrays in an illustrative embodiment. It is to be understood that this particular process is only an example, and additional or alternative processes can be carried out in other embodiments. Specifically, it is noted that FIG. 10 presents merely an example embodiment incorporating techniques and hardware componentry for automatically limiting power consumption by devices using infrared or radio communications, as further detailed herein (and depicted in FIG. 11).

In this embodiment, the process includes steps 1000 through 1006. Step 1000 includes generating and outputting one or more signals via at least one user identification device associated with at least one user. The one or more signals output via the at least one user identification device can include an infrared light-emitting diode flash. Also, in one or more embodiments, the one or more signals output via the at least one user identification device include an analog signal. For example, such an analog signal is utilized to wake-up an analog circuit of an emitting sensor that turns on one or more processors in the emitting sensor. Also, the at least one user identification device associated with at least one user can include at least one wearable device worn by the at least one user.

Step 1002 includes processing one or more signals output by at least one of multiple emitting sensors distributed in an array within a given indoor environment, wherein the one or more signals output by the at least one emitting sensor are output in response to the one or more signals output via the at least one user identification device, and wherein a least a portion of the multiple emitting sensors comprises infrared sensors. The one or more signals output by the at least one emitting sensor can include at least one identifier attributed to the at least one emitting sensor and/or information pertaining to battery level of each of the at least one emitting sensor. Additionally, in one or more embodiments, the one or more signals output by the at least one emitting sensor include one or more signals shaped in a targeted manner via implementation of one or more occluders in connection with the at least one emitting sensor.

Also, in at least one embodiment, the one or more signals output by the at least one emitting sensor include one or more multi-bit infrared data outputs. In such an embodiment, the one or more multi-bit infrared data outputs can include an output comprising at least sixteen bits, wherein at least four of the at least sixteen bits indicate a battery level attributed to the at least one emitting sensor, and wherein at least twelve of the at least sixteen bits indicate at least one unique identifier attributed to the at least one emitting sensor.

Further, in one or more embodiments, the at least one user identification device includes a dark chamber configured to create an angle of signal reception and to reduce intensity of a received signal, and wherein processing the one or more signals output by at least one of multiple emitting sensors includes implementing the dark chamber in connection with the processing.

Step 1004 includes generating a message based at least in part on the processing of the one or more signals output by the at least one emitting sensor, wherein the message pertains to positional information with respect to the given indoor environment. The position information includes a position of the at least one user within the given indoor environment and/or a direction which the at least one user is facing within the given indoor environment. Additionally, in at least one embodiment, the message includes an audio message. In such an embodiment, generating the audio message includes generating the audio messages in one or more languages.

Step 1006 includes outputting the generated message.

Accordingly, the particular processing operations and other functionality described in conjunction with the flow diagram of FIG. 10 are presented by way of illustrative example only, and should not be construed as limiting the scope of the disclosure in any way. For example, the ordering of the process steps may be varied in other embodiments, or certain steps may be performed concurrently with one another rather than serially.

FIG. 11 is a flow diagram of a process for automatically and efficiently limiting power consumption by emitting sensors in an illustrative embodiment. It is to be understood that this particular process is only an example, and additional or alternative processes can be carried out in other embodiments.

In this embodiment, the process includes steps 1100 through 1106. These steps are assumed to be performed at least one of the emitting sensors 103 in the FIG. 1 embodiment.

Step 1100 includes detecting, via at least one photodiode of an emitting sensor, one or more signals output by a user device within a predetermined proximity. In at least one embodiment, the one or more signals detected via the at least one photodiode comprises an infrared pulse.

Step 1102 includes automatically transitioning, via utilizing at least one transistor connected to the at least one photodiode, and in response to detecting the one or more signals, the emitting sensor from a first power-consumption state to a second power-consumption state, wherein the first power-consumption state represents less power consumption than does the second power-consumption state. In at least one embodiment, the at least one transistor includes a gate turn-off thyristor, and wherein automatically transitioning the emitting sensor from the first power-consumption state to the second power-consumption state includes activating the gate turn-off thyristor. Also, in such an embodiment, automatically transitioning the emitting sensor from the second power-consumption state to the first power-consumption state includes deactivating the gate turn-off thyristor. Further, the gate turn-off thyristor can include at least one radio signal transistor. In one or more embodiments, the at least one radio signal transistor includes two radio signal transistors comprising a first transistor with high gain and a second transistor with low reverse current.

Step 1104 includes transmitting one or more signals in response to transitioning the emitting sensor from the first power-consumption state to the second power-consumption state. Step 1106 includes, subsequent to transmitting the one or more signals, automatically transitioning, via utilizing the at least one transistor, the emitting sensor from the second power-consumption state to the first power-consumption state after a predetermined amount of time has elapsed during which no signals were detected via the at least one photodiode. In one or more embodiments, the predetermined amount of time during which no signals were detected via the at least one photodiode comprises one or more milliseconds.

In at least one embodiment, the first power-consumption state comprises consumption of one or more nanowatts of power from at least one battery of the emitting sensor. In such an embodiment, the at least one battery can include at least one battery with a self-discharge rate below a predetermined threshold, wherein such a battery can include a zinc-carbon battery, an alkaline battery, and/or a lithium-ion battery. Further, in one or more embodiments, the first power-consumption state comprises a rate of one or more microampere hours in connection with at least one battery of the emitting sensor.

Accordingly, the particular processing operations and other functionality described in conjunction with the flow diagram of FIG. 11 are presented by way of illustrative example only, and should not be construed as limiting the scope of the disclosure in any way. For example, the ordering of the process steps may be varied in other embodiments, or certain steps may be performed concurrently with one another rather than serially.

The above-described illustrative embodiments provide significant advantages relative to conventional approaches. For example, some embodiments are configured to provide guided positional assistance via emitting sensors implemented with a power-saving mechanism. These and other embodiments can effectively enable the creation of complex wireless sensor networks.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

As mentioned previously, at least portions of the information processing system 100 can be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

Some illustrative embodiments of a processing platform used to implement at least a portion of an information processing system comprises cloud infrastructure including virtual machines implemented using a hypervisor that runs on physical infrastructure. The cloud infrastructure further comprises sets of applications running on respective ones of the virtual machines under the control of the hypervisor. It is also possible to use multiple hypervisors each providing a set of virtual machines using at least one underlying physical machine. Different sets of virtual machines provided by one or more hypervisors may be utilized in configuring multiple instances of various components of the system.

These and other types of cloud infrastructure can be used to provide what is also referred to herein as a multi-tenant environment. One or more system components, or portions thereof, are illustratively implemented for use by tenants of such a multi-tenant environment.

As mentioned previously, cloud infrastructure as disclosed herein can include cloud-based systems. Virtual machines provided in such systems can be used to implement at least portions of a computer system in illustrative embodiments.

In some embodiments, the cloud infrastructure additionally or alternatively comprises a plurality of containers implemented using container host devices. For example, as detailed herein, a given container of cloud infrastructure illustratively comprises a Docker container or other type of Linux Container (LXC). The containers are run on virtual machines in a multi-tenant environment, although other arrangements are possible. The containers are utilized to implement a variety of different types of functionality within the system 100. For example, containers can be used to implement respective processing devices providing compute and/or storage services of a cloud-based system. Again, containers may be used in combination with other virtualization infrastructure such as virtual machines implemented using a hypervisor.

Illustrative embodiments of processing platforms will now be described in greater detail with reference to FIGS. 12 and 13. Although described in the context of system 100, these platforms may also be used to implement at least portions of other information processing systems in other embodiments.

FIG. 12 shows an example processing platform comprising cloud infrastructure 1200. The cloud infrastructure 1200 comprises a combination of physical and virtual processing resources that are utilized to implement at least a portion of the information processing system 100. The cloud infrastructure 1200 comprises multiple virtual machines (VMs) and/or container sets 1202-1, 1202-2, . . . 1202-L implemented using virtualization infrastructure 1204. The virtualization infrastructure 1204 runs on physical infrastructure 1205, and illustratively comprises one or more hypervisors and/or operating system level virtualization infrastructure. The operating system level virtualization infrastructure illustratively comprises kernel control groups of a Linux operating system or other type of operating system.

The cloud infrastructure 1200 further comprises sets of applications 1210-1, 1210-2, . . . 1210-L running on respective ones of the VMs/container sets 1202-1, 1202-2, . . . 1202-L under the control of the virtualization infrastructure 1204. The VMs/container sets 1202 comprise respective VMs, respective sets of one or more containers, or respective sets of one or more containers running in VMs. In some implementations of the FIG. 12 embodiment, the VMs/container sets 1202 comprise respective VMs implemented using virtualization infrastructure 1204 that comprises at least one hypervisor.

A hypervisor platform may be used to implement a hypervisor within the virtualization infrastructure 1204, wherein the hypervisor platform has an associated virtual infrastructure management system. The underlying physical machines comprise one or more distributed processing platforms that include one or more storage systems.

In other implementations of the FIG. 12 embodiment, the VMs/container sets 1202 comprise respective containers implemented using virtualization infrastructure 1204 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element is viewed as an example of what is more generally referred to herein as a "processing device." The cloud infrastructure 1200 shown in FIG. 12 may represent at least a portion of one processing platform. Another example of such a processing platform is processing platform 1300 shown in FIG. 13.

The processing platform 1300 in this embodiment comprises a portion of system 100 and includes a plurality of processing devices, denoted 1302-1, 1302-2, 1302-3, . . . 1302-K, which communicate with one another over a network 1304.

The network 1304 comprises any type of network, including by way of example a global computer network such as the Internet, a WAN, a LAN, a satellite network, a telephone or cable network, a cellular network, a wireless network such as a Wi-Fi or WiMAX network, or various portions or combinations of these and other types of networks.

The processing device 1302-1 in the processing platform 1300 comprises a processor 1310 coupled to a memory 1312.

The processor 1310 comprises a microprocessor, a microcontroller, an application-specific integrated circuit (ASIC), a field-programmable gate array (FPGA) or other type of processing circuitry, as well as portions or combinations of such circuitry elements.

The memory 1312 comprises random access memory (RAM), read-only memory (ROM) or other types of memory, in any combination. The memory 1312 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture comprises, for example, a storage array, a storage disk or an integrated circuit containing RAM, ROM or other electronic memory, or any of a wide variety of other types of computer program products. The term "article of manufacture" as used herein should be understood to exclude transitory, propagating signals.

Numerous other types of computer program products comprising processor-readable storage media can be used.

Also included in the processing device 1302-1 is network interface circuitry 1314, which is used to interface the processing device with the network 1304 and other system components, and may comprise conventional transceivers.

The other processing devices 1302 of the processing platform 1300 are assumed to be configured in a manner similar to that shown for processing device 1302-1 in the figure.

Again, the particular processing platform 1300 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise different types of virtualization infrastructure, in place of or in addition to virtualization infrastructure comprising virtual machines. Such virtualization infrastructure illustratively includes container-based virtualization infrastructure configured to provide Docker containers or other types of LXCs.

As another example, portions of a given processing platform in some embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage products or devices, or other components are possible in the information processing system 100. Such components can communicate with other elements of the information processing system 100 over any type of network or other communication media.

For example, particular types of storage products that can be used in implementing a given storage system of a distributed processing system in an illustrative embodiment include all-flash and hybrid flash storage arrays, scale-out all-flash storage arrays, scale-out NAS clusters, or other types of storage arrays. Combinations of multiple ones of these and other storage products can also be used in implementing a given storage system in an illustrative embodiment.

It should again be emphasized that the above-described embodiments are presented for purposes of illustration only. Many variations and other alternative embodiments may be used. Also, the particular configurations of system and device elements and associated processing operations illustratively shown in the drawings can be varied in other embodiments. Thus, for example, the particular types of information processing systems, sensors and devices in a given embodiment and their respective configurations may be varied. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A computer-implemented method comprising:
    detecting, via at least one photodiode of an emitting sensor, one or more signals output by a user device within a predetermined proximity;
    automatically transitioning, via utilizing at least one transistor connected to the at least one photodiode, and in response to detecting the one or more signals, the emitting sensor from a first power-consumption state to a second power-consumption state, wherein the first power-consumption state represents less power consumption than does the second power-consumption state, wherein the at least one transistor comprises a gate turn-off thyristor comprising at least one radio signal transistor, and wherein automatically transitioning the emitting sensor from the first power-consumption state to the second power-consumption state comprises activating the gate turn-off thyristor;
    transmitting one or more signals in response to transitioning the emitting sensor from the first power-consumption state to the second power-consumption state; and
    subsequent to transmitting the one or more signals, automatically transitioning, via utilizing the at least one transistor, the emitting sensor from the second power-consumption state to the first power-consumption state after a predetermined amount of time has elapsed during which no signals were detected via the at least one photodiode, wherein automatically transitioning the emitting sensor from the second power-consumption state to the first power-consumption state comprises deactivating the gate turn-off thyristor;
    wherein the method is performed by the emitting sensor comprising a processor coupled to a memory.

2. The computer-implemented method of claim 1, wherein the at least one radio signal transistor comprises two radio signal transistors comprising a first transistor with high gain and a second transistor with low reverse current.

3. The computer-implemented method of claim 1, wherein the first power-consumption state comprises consumption of one or more nanowatts of power from at least one battery of the emitting sensor.

4. The computer-implemented method of claim 3, wherein the at least one battery comprises at least one battery with a self-discharge rate below a predetermined threshold.

5. The computer-implemented method of claim 4, wherein the at least one battery with a self-discharge rate below a predetermined threshold comprises at least one of a zinc-carbon battery, an alkaline battery, and a lithium-ion battery.

6. The computer-implemented method of claim 1, wherein the first power-consumption state comprises a rate of one or more microampere hours in connection with at least one battery of the emitting sensor.

7. The computer-implemented method of claim 1, wherein the predetermined amount of time during which no signals were detected via the at least one photodiode comprises one or more milliseconds.

8. The computer-implemented method of claim 1, wherein the one or more signals detected via the at least one photodiode comprises an infrared pulse.

9. A non-transitory processor-readable storage medium having stored therein program code of one or more software programs, wherein the program code when executed by at least one processing device causes the at least one processing device:
to detect, via at least one photodiode of an emitting sensor, one or more signals output by a user device within a predetermined proximity;
to automatically transition, via utilizing at least one transistor connected to the at least one photodiode, and in response to detecting the one or more signals, the emitting sensor from a first power-consumption state to a second power-consumption state, wherein the first power-consumption state represents less power consumption than does the second power-consumption state, wherein the at least one transistor comprises a gate turn-off thyristor comprising at least one radio signal transistor, and wherein automatically transitioning the emitting sensor from the first power-consumption state to the second power-consumption state comprises activating the gate turn-off thyristor;
to transmit one or more signals in response to transitioning the emitting sensor from the first power-consumption state to the second power-consumption state; and
subsequent to transmitting the one or more signals, to automatically transition, via utilizing the at least one transistor, the emitting sensor from the second power-consumption state to the first power-consumption state after a predetermined amount of time has elapsed during which no signals were detected via the at least one photodiode, wherein automatically transitioning the emitting sensor from the second power-consumption state to the first power-consumption state comprises deactivating the gate turn-off thyristor.

10. The non-transitory processor-readable storage medium of claim 9, wherein the one or more signals detected via the at least one photodiode comprises an infrared pulse.

11. The non-transitory processor-readable storage medium of claim 9, wherein the at least one radio signal transistor comprises two radio signal transistors comprising a first transistor with high gain and a second transistor with low reverse current.

12. The non-transitory processor-readable storage medium of claim 9, wherein the first power-consumption state comprises consumption of one or more nanowatts of power from at least one battery of the emitting sensor.

13. The non-transitory processor-readable storage medium of claim 9, wherein the first power-consumption state comprises a rate of one or more microampere hours in connection with at least one battery of the emitting sensor.

14. The non-transitory processor-readable storage medium of claim 9, wherein the predetermined amount of time during which no signals were detected via the at least one photodiode comprises one or more milliseconds.

15. An apparatus comprising:
at least one processing device comprising a processor coupled to a memory;
the at least one processing device being configured:
to detect, via at least one photodiode of an emitting sensor, one or more signals output by a user device within a predetermined proximity;
to automatically transition, via utilizing at least one transistor connected to the at least one photodiode, and in response to detecting the one or more signals, the emitting sensor from a first power-consumption state to a second power-consumption state, wherein the first power-consumption state represents less power consumption than does the second power-consumption state, wherein the at least one transistor comprises a gate turn-off thyristor comprising at least one radio signal transistor, and wherein automatically transitioning the emitting sensor from the first power-consumption state to the second power-consumption state comprises activating the gate turn-off thyristor;
to transmit one or more signals in response to transitioning the emitting sensor from the first power-consumption state to the second power-consumption state; and
subsequent to transmitting the one or more signals, to automatically transition, via utilizing the at least one transistor, the emitting sensor from the second power-consumption state to the first power-consumption state after a predetermined amount of time has elapsed during which no signals were detected via the at least one photodiode, wherein automatically transitioning the emitting sensor from the second power-consumption state to the first power-consumption state comprises deactivating the gate turn-off thyristor.

16. The apparatus of claim 15, wherein the one or more signals detected via the at least one photodiode comprises an infrared pulse.

17. The apparatus of claim 15, wherein the at least one radio signal transistor comprises two radio signal transistors comprising a first transistor with high gain and a second transistor with low reverse current.

18. The apparatus of claim 15, wherein the first power-consumption state comprises consumption of one or more nanowatts of power from at least one battery of the emitting sensor.

19. The apparatus of claim 15, wherein the first power-consumption state comprises a rate of one or more microampere hours in connection with at least one battery of the emitting sensor.

20. The apparatus of claim 15, wherein the predetermined amount of time during which no signals were detected via the at least one photodiode comprises one or more milliseconds.

* * * * *